United States Patent
Castagnetti et al.

(10) Patent No.: US 6,778,462 B1
(45) Date of Patent: Aug. 17, 2004

(54) METAL-PROGRAMMABLE SINGLE-PORT SRAM ARRAY FOR DUAL-PORT FUNCTIONALITY

(75) Inventors: Ruggero Castagnetti, Menlo Park, CA (US); Ramnath Ventatraman, San Jose, CA (US); Subramanian Ramesh, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 46 days.

(21) Appl. No.: 10/431,940

(22) Filed: May 8, 2003

(51) Int. Cl.⁷ ................................................ G11C 8/00

(52) U.S. Cl. ..................................... 365/230.05; 365/63

(58) Field of Search ............................. 365/230.04, 63, 365/51

(56) References Cited

U.S. PATENT DOCUMENTS 6,266,263 B1 * 7/2001 Lien et al. ..................... 365/49
6,380,592 B2 * 4/2002 Tooher et al. ............... 365/203

* cited by examiner

Primary Examiner—Thong Quoc Le
(74) Attorney, Agent, or Firm—Carstens, Yee & Cahoon, LLP

(57) ABSTRACT

The present invention provides a method and apparatus for providing dual-port capability to an SRAM array. The internal nodes of two single-port memory cells are connected to each other through metal-layer programming to form a dual-port memory cell. In a preferred embodiment, a split word line design is used for each single-port memory cell, to facilitate dual-port memory access while minimizing the need for IC layout space. An additional benefit of the present invention is that it allows "slices" of a memory array to be converted into dual-port memory, so as to allow both single-port and dual-port memory cells in the same memory array.

20 Claims, 5 Drawing Sheets

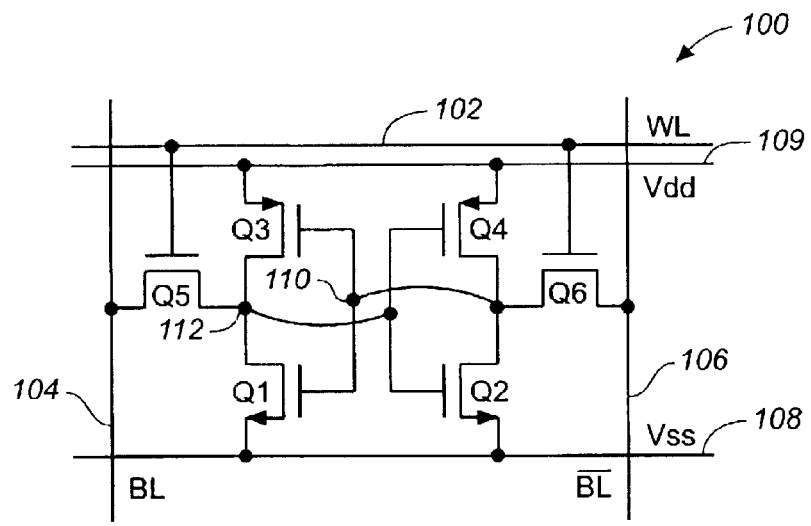
FIG._1 *(PRIOR ART)*
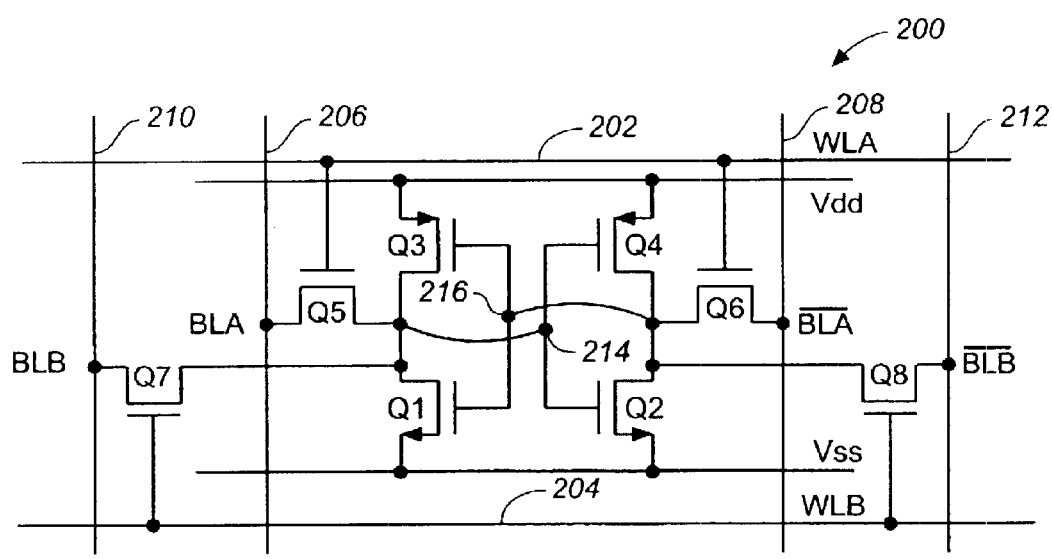
FIG._2 *(PRIOR ART)*

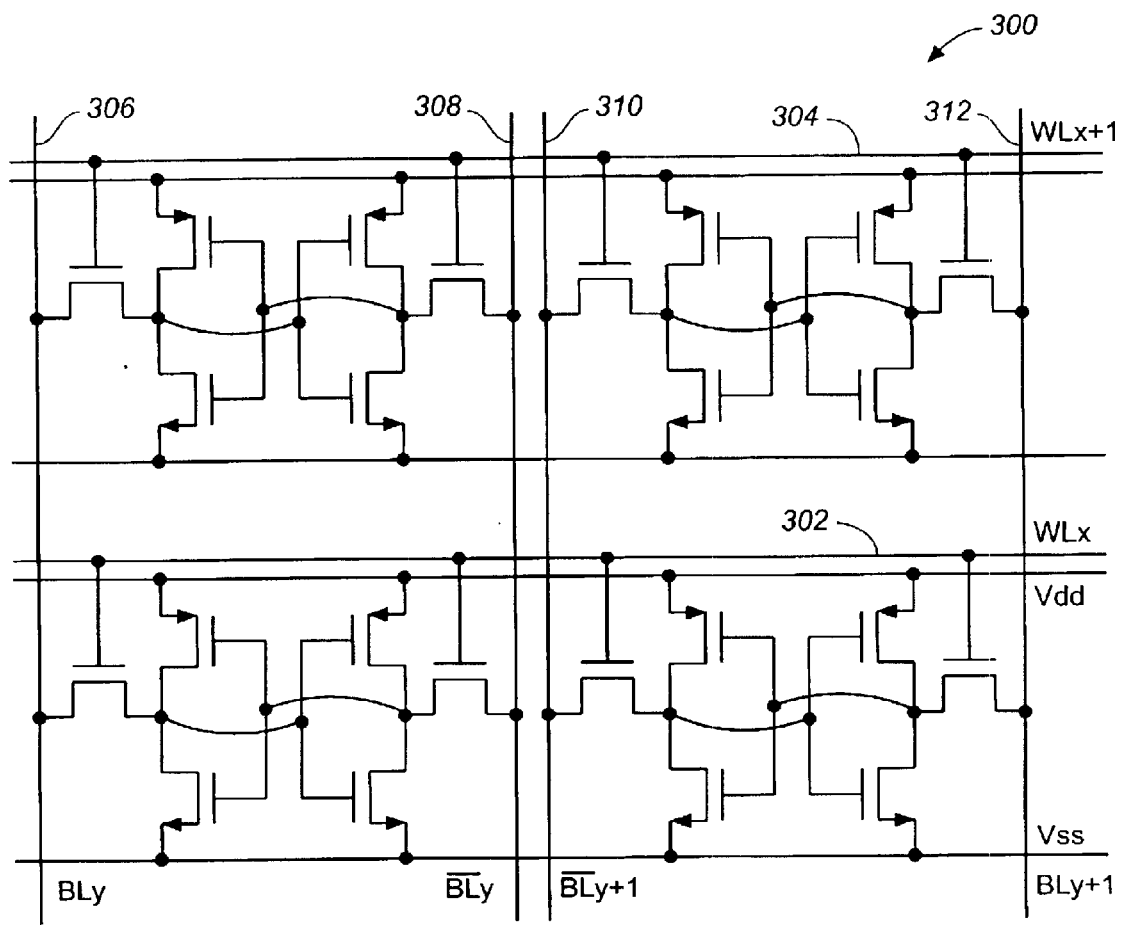
FIG._3 *(PRIOR ART)*

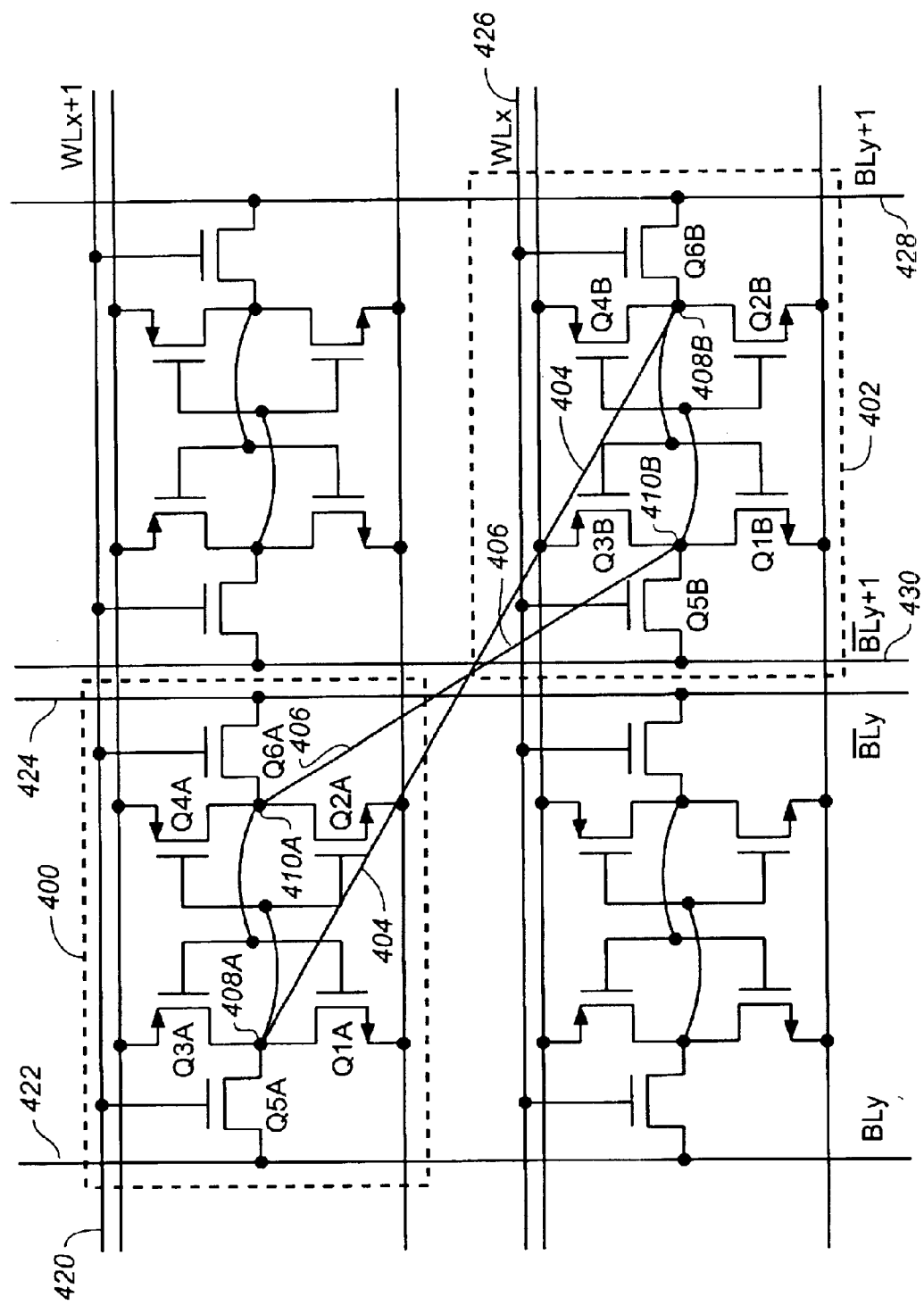
FIG._4

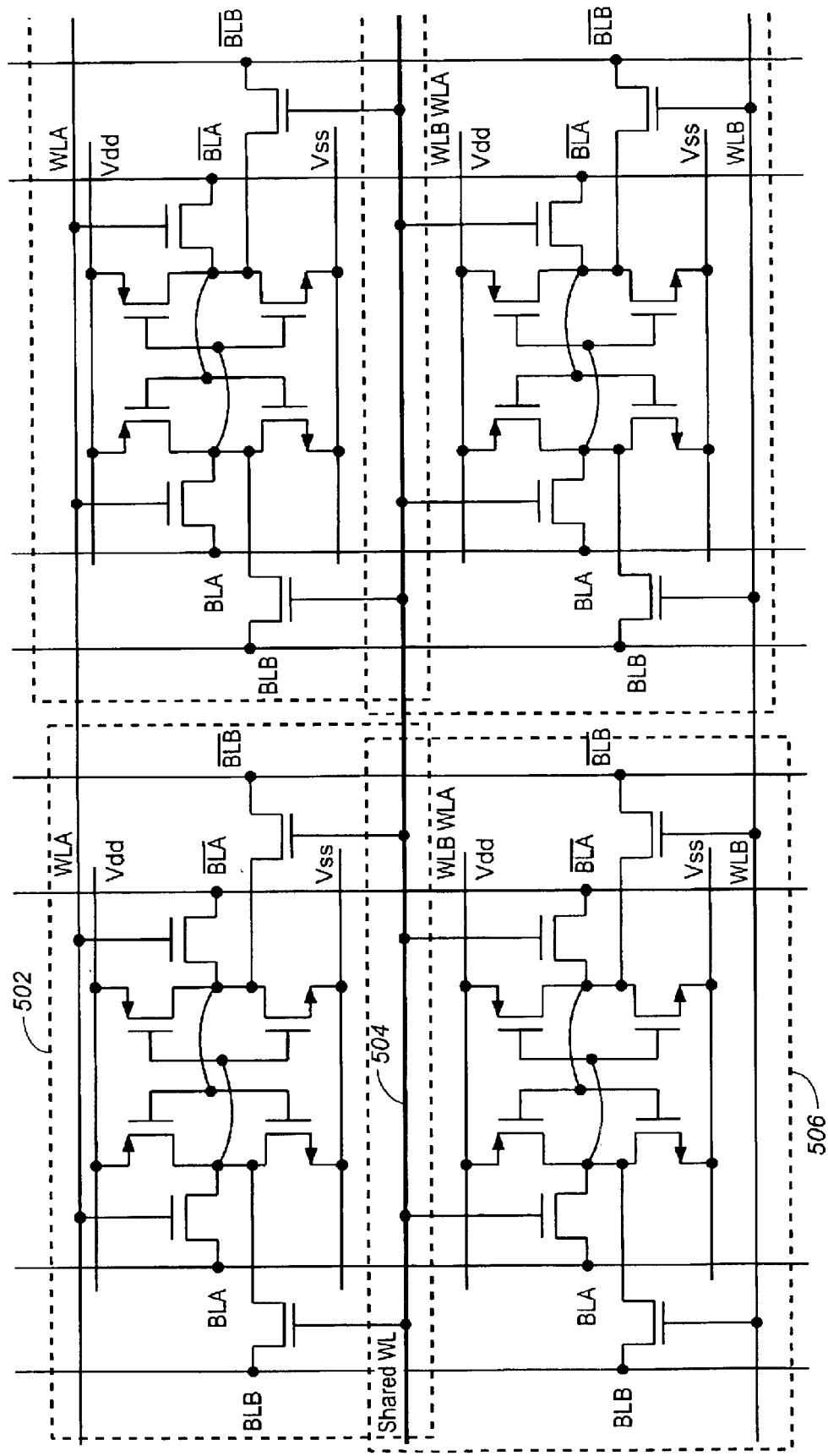
FIG._5

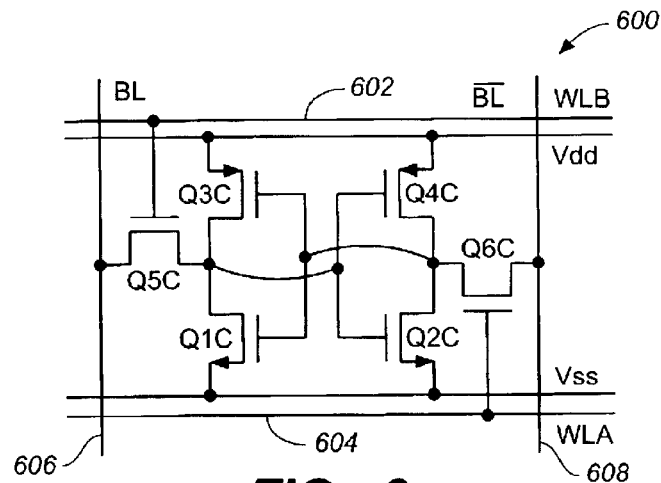
FIG._6
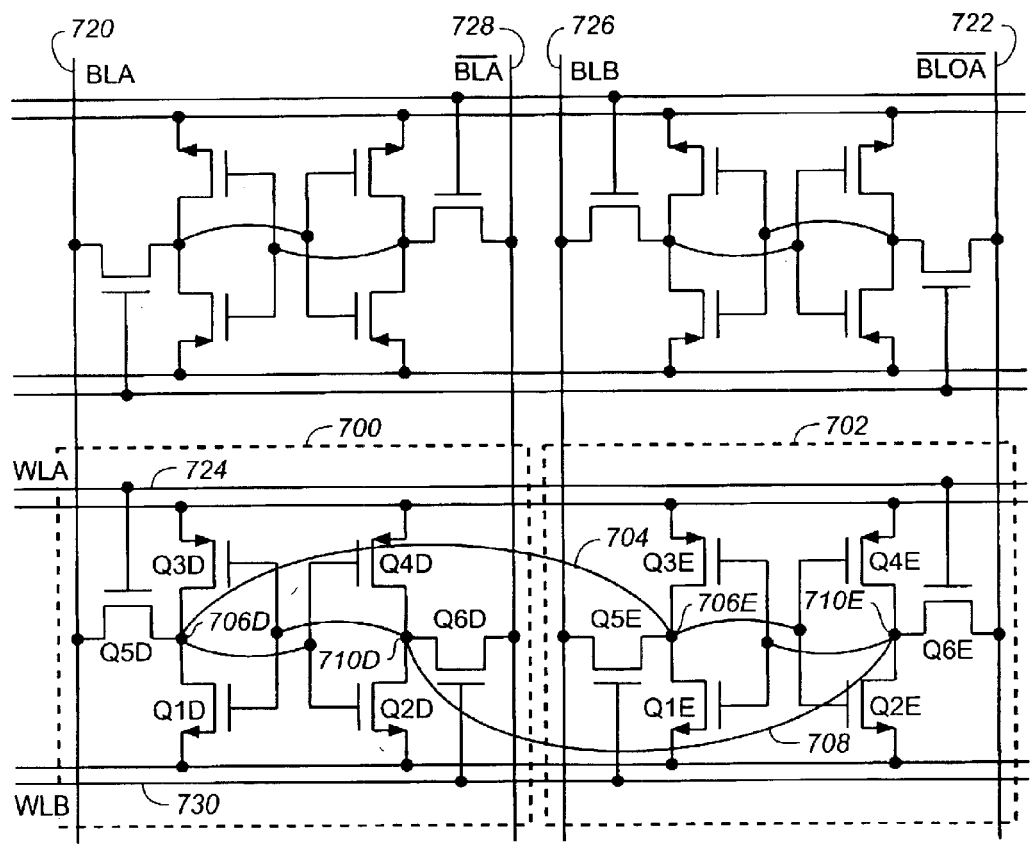
FIG._7

METAL-PROGRAMMABLE SINGLE-PORT SRAM ARRAY FOR DUAL-PORT FUNCTIONALITY

BACKGROUND OF THE INVENTION

1. Technical Field

The present invention is directed generally toward a method and apparatus for implementing a dual-port static random-access memory in an integrated circuit.

2. Description of the Related Art

There are two basic types of semiconductor random-access memory (RAM) circuits in common use. Static random-access memory (SRAM) stores data by way of a feedback circuit. Dynamic random-access memory (DRAM) stores data as electrostatic charge on a capacitor. In general, RAM circuits are configured in two-dimensional arrays of individual memory cells, with each memory cell storing one bit. A word of data may be accessed from one or more memory circuits by addressing the cells that store the data by row and column addresses and reading or writing data to or from the addressed cells. In a typical SRAM array, each memory word is stored in a separate row and addressed by asserting a "word line," while the individual bits of each word are read from and written to the memory array using "bit lines." In a typical single-port memory array, all bit lines for a particular bit position are connected together. For example, all memory cells representing bit position 4 of a word typically share common bit lines, but have separate word lines. The generic term for word lines and bit lines is "address lines," as address lines are used for addressing individual memory cells.

Memory circuits may be single-port or multi-port memory circuits. Single-port circuits are capable of allowing access to a single memory location (i.e., one cell or a group of cells at a single memory address). Multi-port circuits allow two or more memory addresses to be accessed concurrently. Specifically, a "port" is a set of related address lines that together are sufficient to perform one memory access at a particular point in time. Thus, a single-port memory cell, which only has one port, is capable of supporting only one access at a time, while a dual-port memory cell, which has two ports, is capable of supporting two simultaneous memory accesses. Higher-order multi-port cells (e.g., three-port, four-port, etc. . . . ), which support larger numbers of simultaneous accesses, are also possible.

FIG. 1 is a diagram of a typical six-transistor single-port complementary metal-oxide semiconductor (CMOS) SRAM circuit 100 as known in the art. SRAM circuit 100 is perhaps the most common circuit topology for a single-port SRAM. SRAM circuit 100 includes a flip-flop circuit, which is formed by cross-coupling two logic inverters formed by transistors Q1–Q4, and two pass-gate transistors (also called access transistors) Q5 and Q6.

Specifically, PMOS (p-channel MOS) transistor Q3 and NMOS (n-channel MOS) transistor Q1 form one CMOS inverter and PMOS transistor Q4 and NMOS transistor Q2 form another CMOS inverter. Referring to the inverter formed by transistors Q3 and Q1, the gates of transistors Q3 and Q1 are connected together to form an input node 110 to the inverter. The sources of transistors Q3 and Q1 are connected together to form an output node 112 of the inverter. The drain of transistor Q3 is connected to positive supply rail Vdd 106, making transistor Q3 the "pull-up" transistor of the inverter. The drain of transistor Q1 is connected to negative (or "low") supply rail Vss 108, making transistor Q1 the "pull-down" transistor of the inverter. Transistors Q4 and Q2 are similarly configured as a CMOS inverter. In SRAM circuit 100, the CMOS inverter formed by transistors Q4 and Q2 is cross-coupled with the CMOS inverter formed by transistors Q3 and Q1. Thus, node 110, which is the input node of the inverter formed by transistors Q3 and Q1, forms the output node of the inverter formed by transistors Q4 and Q2, and node 112, which is the output node of the inverter formed by transistors Q3 and Q1, forms the input node of the inverter formed by transistors Q4 and Q2.

Nodes 110 and 112 are referred to as the "internal nodes" of SRAM circuit 100. For the purposes of this document, the term "internal node" is defined as a data-storing node in an SRAM circuit. In the case of circuit 100, nodes 110 and 112, because they form part of the feedback loop of the cross-connected CMOS inverters (transistors Q1–Q4), are data-storing nodes and are, therefore, "internal nodes," for the purposes of this document.

Pass-gate transistors Q5 and Q6 are MOS transistors configured as switches. The gates of transistors Q5 and Q6 are connected to word line 102. The source and drain of pass-gate transistor Q5 are connected between bit line 104 and node 112. The source and drain of pass-gate transistor Q6 are connected between inverse bit line 106 and node 110. Pass-gate transistors Q5 and Q6 are turned on when word line 102 is selected (i.e., raised in voltage) and connect bit lines 104 and 106 to the flip-flop formed by transistors Q1–Q4. When pass-gate transistors Q5 and Q6 switch bit lines 104 and 106 into connection with internal nodes 110 and 112, the data stored by memory circuit 100 becomes available on bit line 104, and the complement of that data becomes available on inverse bit line 106, so reading from memory circuit 100 becomes possible. To write data to memory circuit 100, word line 102 is selected, the data to be stored is asserted on bit line 104, and the complement of that data is asserted on inverse bit line 106. Since transistors Q1–Q4 form a bistable circuit (i.e., a circuit with two stable states), asserting the new data on bit lines 104 and 106 results in putting this bistable circuit into the stable state associated with the stored data. When word line 102 is no longer asserted, transistors Q1–Q4 maintain the same stable state, and thus store the written data until power is no longer available from power supply rails 108 and 109.

FIG. 2 is a diagram of a typical dual-port memory circuit 200 that is based on the six-transistor single-port circuit 100 in FIG. 1. Dual-port circuit 200 uses two word lines 202 and 204 for each word and two sets of bit lines (bit lines 206 and 208 and bit lines 210 and 212) for each bit position. Dual-port circuit 200 contains the same configuration of six transistors (Q1–Q4) as single-port circuit 100, but includes additional pass-gate transistors Q7 and Q8, which connect additional bit lines 210 and 212 to the internal nodes, nodes 214 and 216. Thus, with two separate bit line-word line-pass-gate transistor combinations in each memory cell, dual-port operation is achieved.

FIG. 3 is a diagram showing how a typical SRAM memory array 300 is configured from individual memory cells. Memory array 300 is a single-port memory array (i.e., it consists of only single-port memory cells and supports only one memory access at a time), although multi-port memory arrays are also common. In memory array 300, words are arranged in rows, and bit positions are arranged in columns. For instance, word line 302 enables access to all of the bits in the memory word represented by that row, while word line 304 enables access to all of the bits in the succeeding memory word in the memory space provided by memory array 300.

Each column in memory array 300 represents a bit position within a word. Thus, bit line 306 and its complement bit line 308 represent a particular bit position, while bit line 310 and its complement bit line 312 represent the succeeding bit position. Note that all of memory cells corresponding to a particular bit position are connected to the same word lines. Thus, each individual memory cell in memory array 300 is accessed by row and column.

In "system on a chip" (SoC) applications, where a complete system of components is manufactured on a single integrated circuit (IC), SRAM arrays, such as that depicted in FIG. 3, may serve any of a variety of functions. The six-transistor SRAM cell depicted in FIG. 1 (memory circuit 100) is regarded as being the most common SRAM cell currently in use in industry, since the six-transistor SRAM cell is fast and also suitable for high-density applications, where space in the IC layout is at a premium.

In many communications and networking applications, multi-port SRAM cells are often used, because they offer the capability of simultaneous memory access from multiple ports. The eight-transistor dual-port memory cell depicted in FIG. 2 is regarded as the most popular topology for a multi-port memory cell. Typically, the SRAM cells in any given memory array are individually designed at the silicon level to provide dedicated single-port or dual-port functionality. This allows the highest level of optimization and customization for density and performance.

In some applications, however, programmability, or at least simplicity of the design process, becomes a priority. When rapid turnaround time or ease of manufacturing is needed, a "programmable" IC, which provides a standardized, generic set of components, such as logic gates or memory cells, can be "programmed" to implement the desired functionality. Thus, rather than laying out each individual transistor circuit in the design, a designer can simply make or break connections between the standard, generic components in the IC to achieve the desired result. Many devices that are called "programmable" may be programmed using some sort of programming apparatus, such as an FPGA (field-programmable gate array) programmer device. Another form of "programming" is "metal programming," in which one or more metal layers in the layout of an IC are used to form connections between the standard component. "Metal programming" is useful for implementing IC designs that are to be commercially manufactured. In general, metal programming allows the designer the convenience of designing a circuit using a programmable device as a basis for the design, but "metal programming" is also rather conducive to mass manufacture, as the "programmed" part of the IC can simply be implemented as a layer in the usual fabrication process, rather than by having to "burn" the programmed part into the IC using a special programmer device.

As some applications require multi-port memory, while others do not, a designer must choose what kind of memory to use (i.e., single- or multi-port) in the application. As programmability can greatly simplify the design process of an IC, it would be desirable to program a memory array to act as a single-port or multi-port memory array, depending on the "metal programming."

SUMMARY OF THE INVENTION

The present invention provides a method and apparatus for providing dual-port capability to an SRAM array. The internal nodes of single-port memory cells are connected to each other through metal-layer programming to form a dual-port memory cell. In a preferred embodiment, a split word line design is used for each single-port memory cell, to facilitate dual-port memory access while minimizing the need for IC layout space. An additional benefit of the present invention is that it allows "slices" of a memory array to be converted into dual-port memory, so as to allow both single-port and dual-port memory cells in the same memory array.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a schematic diagram of a six-transistor single-port SRAM cell as known in the art;

FIG. 2 is a schematic diagram of an eight-transistor dual-port SRAM cell as known in the art;

FIG. 3 is a schematic diagram of a single-port SRAM array as known in the art;

FIG. 4 is a schematic diagram of a dual-port memory cell constructed from an array of single-port memory cells in accordance with a preferred embodiment of the present invention;

FIG. 5 is a schematic diagram of an array of dual-port memory cells with shared word lines in accordance with an alternative embodiment of the present invention;

FIG. 6 is a schematic diagram of a split-word line single-port memory cell that may-be used in a preferred embodiment of the-present invention; and FIG. 7 is a schematic diagram of a dual-port memory cell constructed from an array of single-port split-word line memory cells in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

The present invention is directed toward utilizing single-port SRAM cells for providing multi-port accessibility. The present invention allows an array of single-port SRAM cells to be programmed with a single layer of metal to enable multi-port access of a "slice" of memory. This concept of a memory "slice" can be attractive for recently proposed semi-standardized ASIC chips that share the front-end portion of the silicon, while customization for each individual application and customer occurs using the metal layers. This allows development and reticle costs to be reduced.

With reference now to the figures and in particular with reference to FIG. 4, a schematic diagram of a metal-programmed dual-port memory cell is depicted in accordance with a preferred embodiment of the present invention. Memory cell 400 and memory cell 402 are single-port memory cells using the six-transistor circuit design depicted in FIG. 1, and make up the dual-port memory cell. Memory cells 400 and 402 are positioned diagonally from each other, so that memory cell 400 has different word and bit lines from memory cell 402. The two single-port memory cells, memory cells 400 and 402, are converted into a single dual-port memory cell by connecting corresponding internal nodes between memory cells 400 and 402.

In FIG. 4, internal node 408A of memory cell 400 is connected to internal node 408B of memory cell 402 by a metal connection 404, which will typically be implemented as a trace in a metal layer of the integrated circuit layout. Similarly, internal node 410A of memory cell 400 is connected to corresponding internal node 410B of memory cell 402 by metal connection 406. By connecting corresponding internal nodes together in this fashion, the information stored in one single-port memory cell (e.g., memory cell 400) will also be stored in the other connected single-port memory cell (e.g., memory cell 402), since both memory cells share the same internal nodes.

The resulting circuit has two independent ports. The first port is made up of word line 420 and bit lines 422 and 424, which correspond to single-port cell 400. The second port is made up of word line 426 and bit lines 428 and 430, which correspond to single-port cell 402. Since the internal nodes of single-port cells 400 and 402 are connected, however, they share the same data.

In FIG. 4, metal connections 404 and 406 are depicted as crossing each other. One of ordinary skill in the art will recognize, however, that the actual physical layout of the circuit depicted in FIG. 4 can be constructed so as to prevent metal connections 404 and 406 from overlapping. When metal connections 404 and 406 do not overlap, metal connections 404 and 406 may be constructed as part of the same metal layer in the layout. The derivation of a physical IC layout with non-overlapping metal connections from the schematic diagram FIG. 4 is within the scope of ordinary skill in the integrated circuit art, so no further discussion of physical circuit layouts will be made.

The circuit depicted in FIG. 4 has a number of advantages. As stated previously, single-layer metal programmability allows "slices" of a single-port SRAM array to be converted into dual-port SRAM circuits. One of ordinary skill in the art will also recognize that three-port, four-port, and other higher-order multi-port circuits may be constructed by connecting the internal nodes of additional single-port SRAM cells in the manner depicted in FIG. 4. Further, the "beta ratio" or stability (i.e., the ratio of the current drive capability of the pulldown device to the current drive capability of the pass gate device) of the circuit depicted in FIG. 4 is maintained at a level that is proportional to the number of ports used.

One potential disadvantage of the embodiment depicted in FIG. 4 is that four single-port cells are required to derive one dual-port cell. This reduces array efficiency (i.e., the number of cells per unit area of the array) down to 25%, which works out to be a 50% of the array efficiency using typical eight-transistor dedicated dual-port cells (assuming the dual-port cells are about twice the size of a single-port cell). One technique that may used to combat this problem is to make use of an array in which rows (or columns) can be shared by different ports of different cells. FIG. 5 is a schematic of such an array, constructed using the eight-transistor dual-port SRAM cells of FIG. 2. In FIG. 5, the "WLB" word line of dual-port cell 502 is shared with dual-port cell 506 as the "WLA" word line of dual-port cell 506 (shared word line 504).

The circuit depicted in FIG. 5 conserves space, because only space for one word line between each consecutive two rows is needed. One of ordinary skill in the art will recognize that although an eight-transistor dual-port cell is used in FIG. 5, the metal-programmed dual-port cell of FIG. 4 (or FIG. 7, for that matter) may be used instead. The shared word line approach of FIG. 5, however, has the potential disadvantage of not allowing simultaneous reads from both ports, as one port is then disturbed by a different cell. In general, this approach is practical only for applications in which one port is strictly used for writes while the other is used for read operations only.

An alternative embodiment of the present invention uses single-port cells with split word lines to address the problem of array efficiency without losing read/write independence of the ports. A typical split word line memory cell 600 is depicted in FIG. 6. Memory cell 600 is based on the six-transistor single-port memory cell depicted in FIG. 1 (memory circuit 100). Unlike memory circuit 100, which uses a single word line 102, memory cell 600 has two word lines, word line 602 and word line 604, each of which is connected to only one of the pass-gate transistors. Word line 602 is connected to the gate terminal of pass-gate transistor Q5C, and word line 604 is connected to the gate terminal of pass-gate transistor Q6C. In normal single-port operation, memory cell 600 is selected by asserting both word line 602 and word line 604 together.

FIG. 7, however, shows how split word line memory cells such as memory cell 600 may be connected in an array and metal-programmed to function as a dual-port memory cell in accordance with a preferred embodiment of the present invention. FIG. 7 shows two split word line single-port memory cells 700 and 702, which form part of the same row. Internal node 706D of memory cell 700 is connected to internal node 706E of memory cell 702 via metal connection 704. Internal node 710D of memory cell 700 is connected to internal node 710E of memory cell 702 via metal connection 708.

Connecting these corresponding internal nodes together forms a dual-port memory cell from the two single-port memory cells, memory cell 700 and memory cell 702. The first port is made up of bit lines 720 and 722 and word line 724, which are connected to pass-gate transistors Q5D and Q6E. The second port is made up of bit lines 726 and 728 and word line 730, which are connected to pass-gate transistors Q6D and Q5E.

Using split word lines with metal programming as in FIG. 7 allows a dual-port memory cell to be assembled from only two single-port memory cells, which saves a significant amount of layout space. The embodiment depicted in FIG. 7 has the additional advantage of supporting fully independent ports. One of ordinary skill in the art will also recognize the that dual-port memory cell embodiment depicted in FIG. 7 may be extended to connect its internal nodes (e.g., nodes 706E and 710E) with the internal nodes of additional single-port memory cells to achieve higher-order multi-port memory cell circuits.

What is claimed is:

1. A method comprising:

connecting at least one internal node of a first random access memory cell to at least one internal node of a second random access memory cell, such that address lines from the first random access memory cell and address lines from the second random access memory cell form at least two ports.

2. The method of claim 1, further comprising:
connecting at least one internal node of a third random access memory cell to at least one internal node of either of the first random access memory cell and the second random access memory cell, such that address lines from the first random access memory cell, the second random access memory cell, and the third random access memory cell form at least three ports.

3. The method of claim 1, wherein the first random access memory cell and the second random access memory cell are positioned on different rows and columns with respect to each other in an array of random access memory cells.

4. The method of claim 1, wherein the first random access memory cell and the second random access memory cell are single-port memory cells.

5. The method of claim 1, wherein the first random access memory cell comprises metal-oxide semiconductor (MOS) transistors.

6. The method of claim 1, wherein the first random access memory cell and the second random access memory cell each have first and second word lines.

7. The method of claim 6, wherein the first random access memory cell and the second random access memory cell are positioned in a common row in an array.

8. The method of claim 1, wherein the at least one internal node of the first random access memory cell and the at least one internal node of the second random access memory cell are connected with metal connections in a physical layout of an integrated circuit.

9. The method of claim 8, wherein the metal connections are implemented in a common metal layer of the physical layout.

10. An integrated circuit comprising:
a first random access memory cell having at least one internal node and a set of address lines;
a second random access memory cell having at least one internal node and a set of address lines;
at least one metal connection connecting the at least one internal node of the first random access memory cell with the at least one internal node of the second random access memory cell, such that the set of address lines of the first random access memory cell and the set of address lines of the second random access memory cell form a plurality of ports.

11. The integrated circuit of claim 10, wherein the first random access memory cell and the second random access memory cell are arranged in an array of random access memory cells.

12. The integrated circuit of claim 11, wherein the first random access memory cell and the second random access memory cell are arranged on different rows and columns with respect to each other in the array.

13. The integrated circuit of claim 11, wherein the first random access memory cell and the second random access memory cell are arranged in a common row in the array.

14. The integrated circuit of claim 11, wherein the array includes single-port random access memory cells.

15. The integrated circuit of claim 10, wherein the first random access memory cell and the second random access memory cell each have two word lines.

16. The integrated circuit of claim 10, wherein the first random access memory cell and the second random access memory cell are single-port random access memory cells.

17. The integrated circuit of claim 11, wherein the array is arranged in rows and random access memory cells in consecutive rows share word lines.

18. An integrated circuit comprising:
a first inverting subcircuit having an input and an output;
a second inverting subcircuit having an input and an output, wherein the input of the second inverting subcircuit is connected to the output of the first inverting subcircuit and the input of the first inverting subcircuit is connected to the output of the second inverting subcircuit;
a first pass-gate transistor configured as a switch connecting the output of the first inverting subcircuit to a first bit line;
a second pass-gate transistor configured as a switch connecting the output of the second inverting subcircuit to a second bit line;
a third inverting subcircuit having an input and an output;
a fourth inverting subcircuit having an input and an output, wherein the input of the fourth inverting subcircuit is connected to the output of the third inverting subcircuit and the input of the third inverting subcircuit is connected to the output of the fourth inverting subcircuit;
a third pass-gate transistor configured as a switch connecting the output of the third inverting subcircuit to a third bit line;
a fourth pass-gate transistor configured as a switch connecting the output of the fourth inverting subcircuit to a fourth bit line;
a first metal connection connecting the output of the first inverting subcircuit to the output of the third inverting subcircuit; and
a second metal connection connecting the output of the second inverting subcircuit to the output of the fourth inverting subcircuit.

19. The integrated circuit of claim 18, wherein a gate of the first pass-gate transistor and a gate of the second pass-gate transistor are connected to a first word line; and
a gate of the third pass-gate transistor and a gate of the fourth pass-gate transistor are connected to a second word line,
whereby the first and second bit lines and the first word line form a first port and the third and fourth bit lines and the second word line form a second port.

20. The integrated circuit of claim 18, wherein a gate of the first pass-gate transistor and a gate of the fourth pass-gate transistor are connected to a first word line; and
a gate of the second pass-gate transistor and a gate of the third pass-gate transistor are connected to a second word line,
whereby the first and fourth bit lines and the first word line form a first port and the second and third bit lines and the second word line form a second port.

* * * * *